US012745365B2

(12) United States Patent
Escamilla et al.

(10) Patent No.: US 12,745,365 B2
(45) Date of Patent: Sep. 22, 2026

(54) SERVER SYSTEM FAN SYSTEM

(71) Applicant: Dell Products L.P., Round Rock, TX (US)

(72) Inventors: Eduardo Escamilla, Round Rock, TX (US); Richard W. Guzman, Lago Vista, TX (US); Juan M. Gonzalez, Round Rock, TX (US); Peter Clark, Taipei (TW)

(73) Assignee: Dell Products L.P., Round Rock, TX (US)

( * ) Notice: Subject to any disclaimer, the term of this patent is extended or adjusted under 35 U.S.C. 154(b) by 379 days.

(21) Appl. No.: 18/511,384

(22) Filed: Nov. 16, 2023

(65) Prior Publication Data

US 2025/0169024 A1 May 22, 2025

(51) Int. Cl.
*H05K 7/20* (2006.01)

(52) U.S. Cl.
CPC ..... *H05K 7/20172* (2013.01); *H05K 7/20727* (2013.01)

(58) Field of Classification Search
CPC ....................... H05K 7/20727; H05K 7/20172
USPC .......................................................... 454/184
See application file for complete search history.

(56) References Cited

U.S. PATENT DOCUMENTS 8,075,248 B2 * 12/2011 Yin .................... H05K 7/20172 415/214.1
8,300,404 B2 * 10/2012 Tan .................... H05K 7/20727 361/679.48
10,485,136 B2 * 11/2019 Gopalakrishna ........ G06F 1/181

OTHER PUBLICATIONS

Bigelow, S. J. (Sep. 7, 2021). 7 Major Server Hardware Components You should know: TechTarget. Search Data Center. https://www.techtarget.com/searchdatacenter/feature/Drill-down-to-basics-with-these-server-hardware-terms.*

* cited by examiner

*Primary Examiner* — Vivek K Shirsat
(74) *Attorney, Agent, or Firm* — Terrile, Cannatti & Chambers, LLP; Stephen A. Terrile

(57) ABSTRACT

An information handling system fan system. The fan system includes a fan system gantry component. The fan system gantry component includes a bottom wall; a front wall physically attached to the bottom wall, the front wall extending substantially perpendicularly from the bottom wall, the front wall defining a plurality of fan aperture portions; and, a rear wall physically attached to the bottom wall, the rear wall extending substantially perpendicularly from the bottom wall, the rear wall defining a plurality of fan apertures and a plurality of rear wall fan attachment apertures, the plurality of rear wall fan attachment apertures being positioned to enable attachment of a plurality of fans to the rear wall of the fan system gantry component, attachment of the plurality of fans to the fan system gantry component bolstering structural integrity of the fan system gantry component.

18 Claims, 14 Drawing Sheets

SERVER SYSTEM FAN SYSTEM

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for a server type information handling system with a server fan system.

In one embodiment, the invention relates to a fan system gantry component comprising a bottom wall; a front wall physically attached to the bottom wall, the front wall extending substantially perpendicularly from the bottom wall, the front wall defining a plurality of fan aperture portions; and, a rear wall physically attached to the bottom wall, the rear wall extending substantially perpendicularly from the bottom wall, the rear wall defining a plurality of fan apertures and a plurality of rear wall fan attachment apertures, the plurality of rear wall fan attachment apertures being positioned to enable attachment of a plurality of fans to the rear wall of the fan system gantry component, attachment of the plurality of fans to the fan system gantry component bolstering structural integrity of the fan system gantry component.

In another embodiment, the invention relates to a fan system comprising a plurality of fans and a fan system gantry component comprising a bottom wall; a front wall physically attached to the bottom wall, the front wall extending substantially perpendicularly from the bottom wall, the front wall defining a plurality of fan aperture portions; and, a rear wall physically attached to the bottom wall, the rear wall extending substantially perpendicularly from the bottom wall, the rear wall defining a plurality of fan apertures and a plurality of rear wall fan attachment apertures, the plurality of rear wall fan attachment apertures being positioned to enable attachment of a plurality of fans to the rear wall of the fan system gantry component, attachment of the plurality of fans to the fan system gantry component bolstering structural integrity of the fan system gantry component.

In another embodiment, the invention relates to a system comprising: a processor; a data bus coupled to the processor; and, a fan system comprising a plurality of fans and a fan system gantry component comprising a bottom wall; a front wall physically attached to the bottom wall, the front wall extending substantially perpendicularly from the bottom wall, the front wall defining a plurality of fan aperture portions; and, a rear wall physically attached to the bottom wall, the rear wall extending substantially perpendicularly from the bottom wall, the rear wall defining a plurality of fan apertures and a plurality of rear wall fan attachment apertures, the plurality of rear wall fan attachment apertures being positioned to enable attachment of a plurality of fans to the rear wall of the fan system gantry component, attachment of the plurality of fans to the fan system gantry component bolstering structural integrity of the fan system gantry component.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
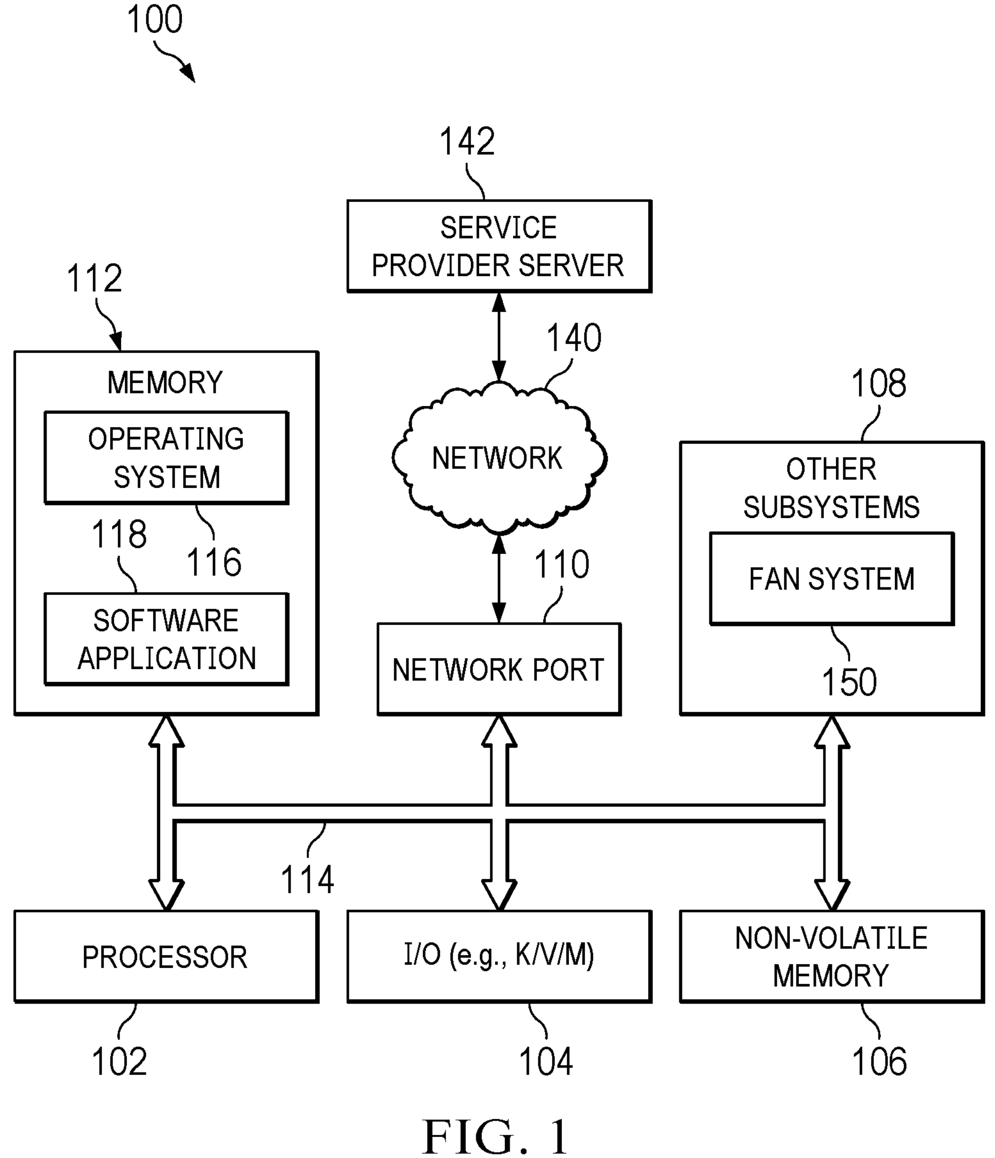
FIG. 1 shows a general illustration of components of an information handling system as implemented in the system and method of the present invention.

Various aspects of the disclosure include an appreciation that it is known to provide server type information handling systems with server fans which are one or both of tool-less and hot-swappable. Various aspects of the disclosure include an appreciation that it is known to provide certain height (e.g., 2 U server height) server type information handling systems with server fans which are one or both of tool-less and hot-swappable.

Various aspects of the disclosure include an appreciation that it is often necessary to design and assemble such fan systems with a fan housing which includes extra parts and a metal gantry component to support a quick-release mechanism on individual fans. This allows fans to be installed and removed quickly. Various aspects of the disclosure include an appreciation that as fans become more stable and efficient, the cost of making a toolless design can provide lower returns. These more reliable fans may never fail or need to be upgraded. This is especially true in hyperscale (HS) environments. Various aspects of the disclosure include an appreciation that it may no longer be desirable to provide information handling systems with fan systems where individual fans are hot-swappable. Various aspects of the disclosure include an appreciation that with such fan systems it would be desirable to reduce the part count for the fan system and specifically for the fan system gantry component without undermining the contribution of the gantry to the overall structural strength of the fan system.

A system and method are disclosed for providing a server fan system that provides a single hot-swappable assembly containing a plurality of fans. In certain embodiments, the server fan system includes a monolithic gantry housing to significantly reduce the number of costly and complex parts. In certain embodiments, the monolithic gantry housing is constructed of plastic. In certain embodiments, structural integrity of the plastic gantry housing is bolstered by designing the gantry such that each fan provides structural element in the fan system assembly. In certain embodiments, the design subassembly can be serviced to replace individual fans using a tool such as a screwdriver. In certain embodiments, the monolithic gantry housing is designed to provide flexibility in the connector placement on a fan board or planar of the information handling system. In certain embodiments, the monolithic gantry housing is designed with air-sealing features which are molded into the part to minimize the need for foam and to optimize cable channels under the gantry.

This fan system design advantageously improves the rigidity of the fan gantry, leading to less chassis sag. This fan system design advantageously uses the fan housing as a structurally bolstering element for the information handling system chassis. In certain embodiments, the fan body holds a connector cover in place, further simplifying the complexity of the molded gantry. This fan system design advantageously provides the fan system with air sealing features and cable channel optimizations.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both the other subsystems 108 or the network port 110 include fan system 150. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the server fan system 150 provides a single hot-swappable assembly containing a plurality of fans. In certain embodiments, the server fan system 150 includes a monolithic gantry housing to significantly reduce the number of costly and complex parts. In certain embodiments, the monolithic gantry housing is constructed of plastic. In certain embodiments, structural integrity of the plastic gantry housing is bolstered (i.e., strengthened) by designing the gantry such that each fan provides structural element in the fan system assembly. In certain embodiments, the design subassembly can be serviced to replace individual fans using a tool such as a screwdriver. In certain embodiments, the monolithic gantry housing is designed to provide flexibility in the connector placement on a fan board or planar of the information handling system. In certain embodiments, the monolithic gantry housing is designed with air-sealing features which are molded into the part to minimize the need for foam and to optimize cable channels under the gantry.

This fan system design advantageously improves the rigidity of the fan gantry, leading to less chassis sag. This fan system design advantageously uses the fan housing as a structurally bolstering element for the information handling system chassis. In certain embodiments, the fan body holds a connector cover in place, further simplifying the complexity of the molded gantry. This fan system design advantageously provides the fan system with air sealing features and cable channel optimizations.

Figure 2:
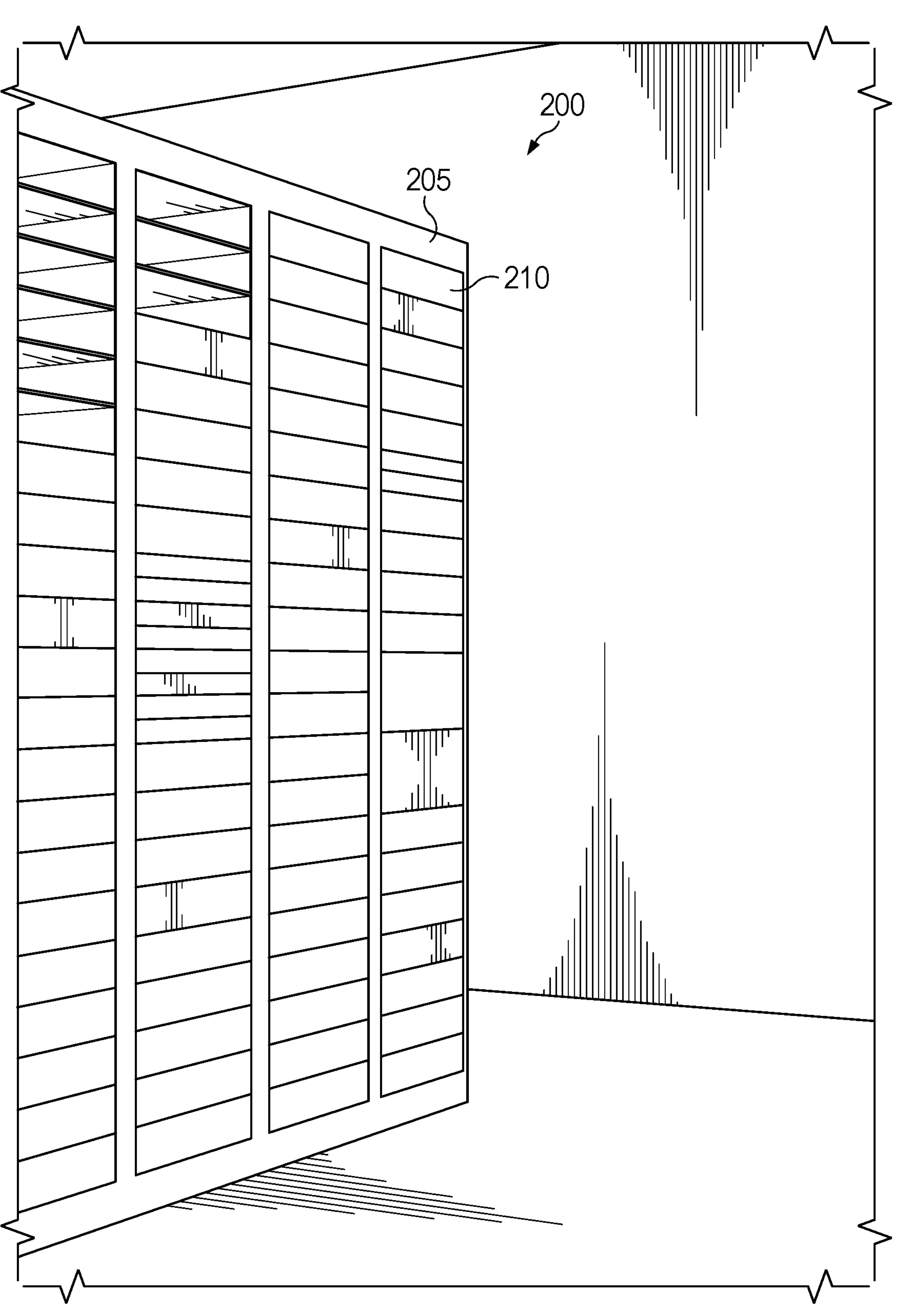
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit and a 4 U rack unit. In general, a 1 U rack unit is substantially (i.e., +/−20%) 1.75" high, a 2 U rack unit is substantially (i.e., +/−20%) 3.5" high and a 4 U rack height is substantially (i.e., +/−20%) 7.0" high.

Figure 3:
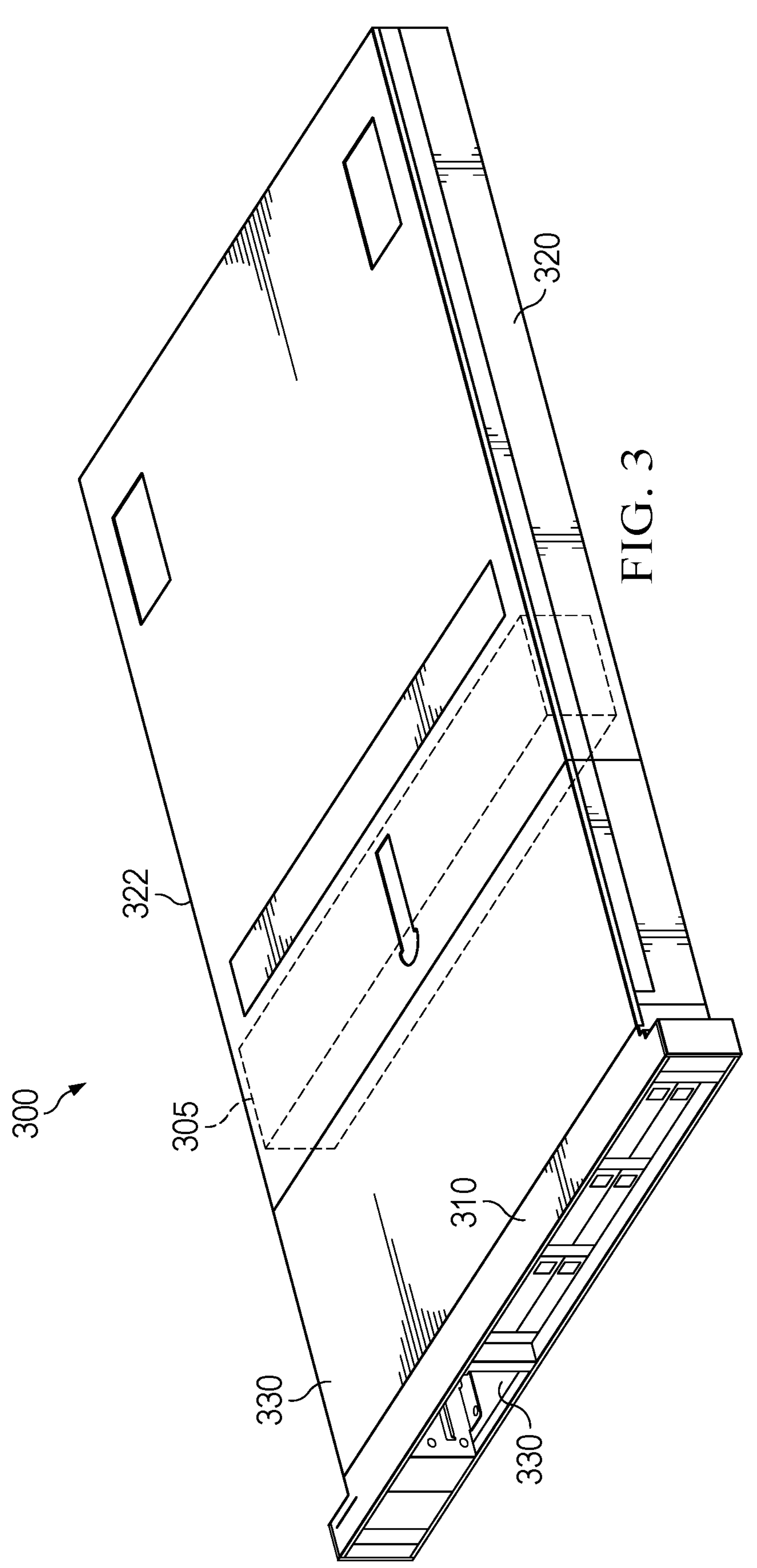
FIG. 3 shows a generalized perspective view of an example server type information handling system.

FIG. 3 shows a generalized perspective view of an example server type information handling system 300 which includes a fan system 305. In certain embodiments, the fan system 305 corresponds to fan system 150.

In certain embodiments, the server type information handling system includes a front portion 310, which is accessible when the server type information handing system 300 is mounted on a server rack. In certain embodiments, the side portions 320, 322 mount to the rack via respective server mounting components. In certain embodiments, the side portions mount to the rack via respective mechanical guiding features which are mechanically coupled to respective server mounting components. In certain embodiments, the server type information handling system can slide out from the rack via the respective mechanical guiding features. In certain embodiments, internal components of the server type information handling system 300 may be accessed by removing a top panel 330 of the server type information handing system 300. In certain embodiments, the server type information handing system 300 includes a bay 350 via which components may be mounted to the server type information handling system. In certain embodiments, the server type information handling system includes an integrated fan system 305. In certain embodiments, the server type information handling system 300 is a 2 U rack unit server type information handling system.

In certain embodiments, the server fan system 305 provides a single hot-swappable assembly containing a plurality of fans. In certain embodiments, the server fan system 305 corresponds to fan system 150. In certain embodiments, the server fan system 305 includes a monolithic gantry housing to significantly reduce the number of costly and complex parts. In certain embodiments, the monolithic gantry housing is constructed of plastic. In certain embodiments, structural integrity of the plastic gantry housing is bolstered by designing the gantry such that each fan provides a structural element in the fan system assembly. In certain embodiments, the design subassembly can be serviced to replace individual fans using a tool such as a screwdriver. In certain embodiments, the monolithic gantry housing is designed to provide flexibility in the connector placement on a fan board or planar of the information handling system. In certain embodiments, the monolithic gantry housing is designed with air-sealing features which are molded into the part to minimize the need for foam and to optimize cable channels under the gantry.

This fan system design advantageously improves the rigidity of the fan gantry, leading to less chassis sag. This fan system design advantageously uses the fan housing as a structurally bolstering element for the information handling system chassis. In certain embodiments, the fan body holds a connector cover in place, further simplifying the complexity of the molded gantry. This fan system design advantageously provides the fan system with air sealing features and cable channel optimizations.

Figure 4A:
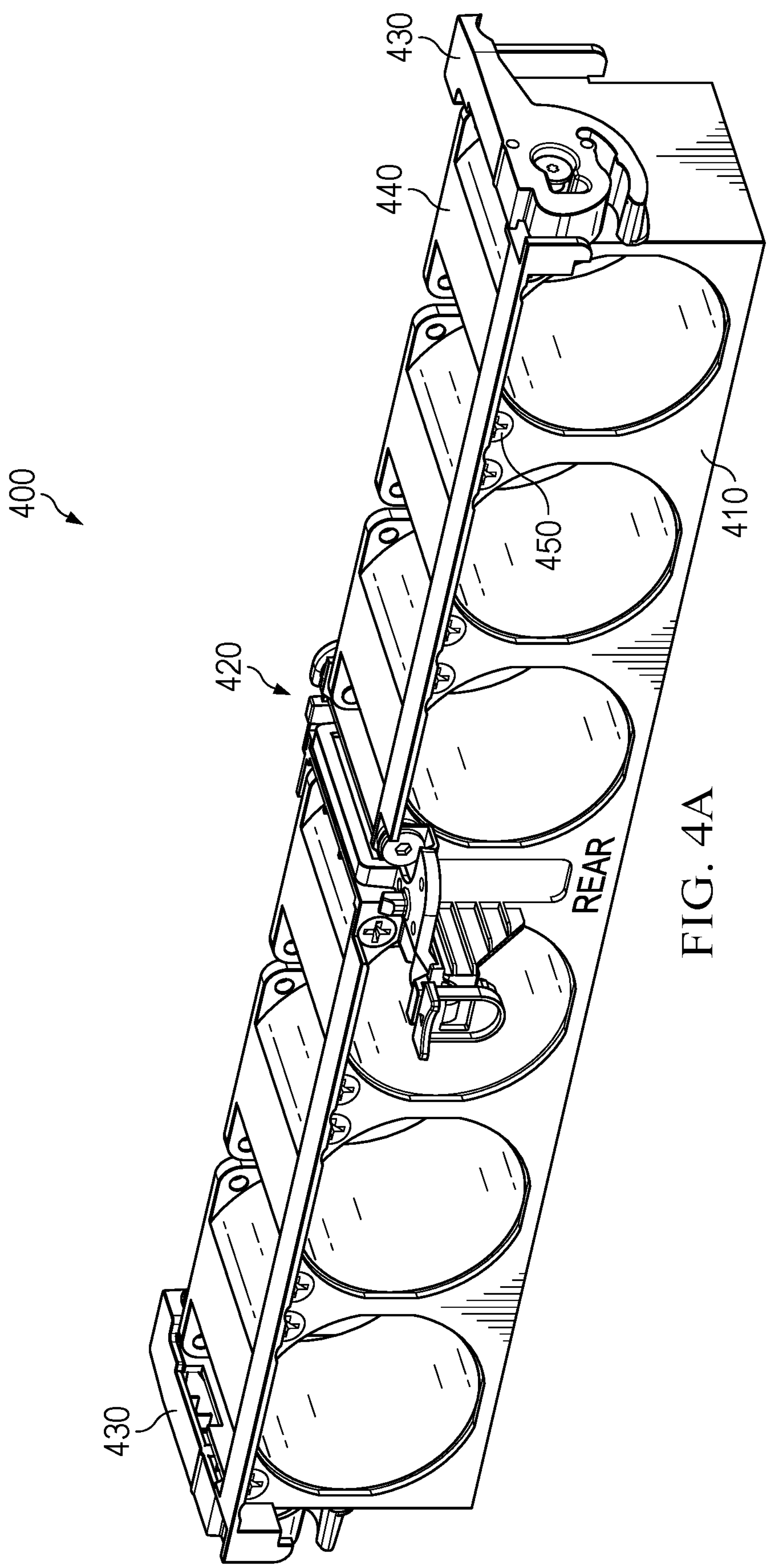
FIGS. 4A and 4B, generally referred to as FIG. 4, show perspective views of a fan system.
Figure 4B:
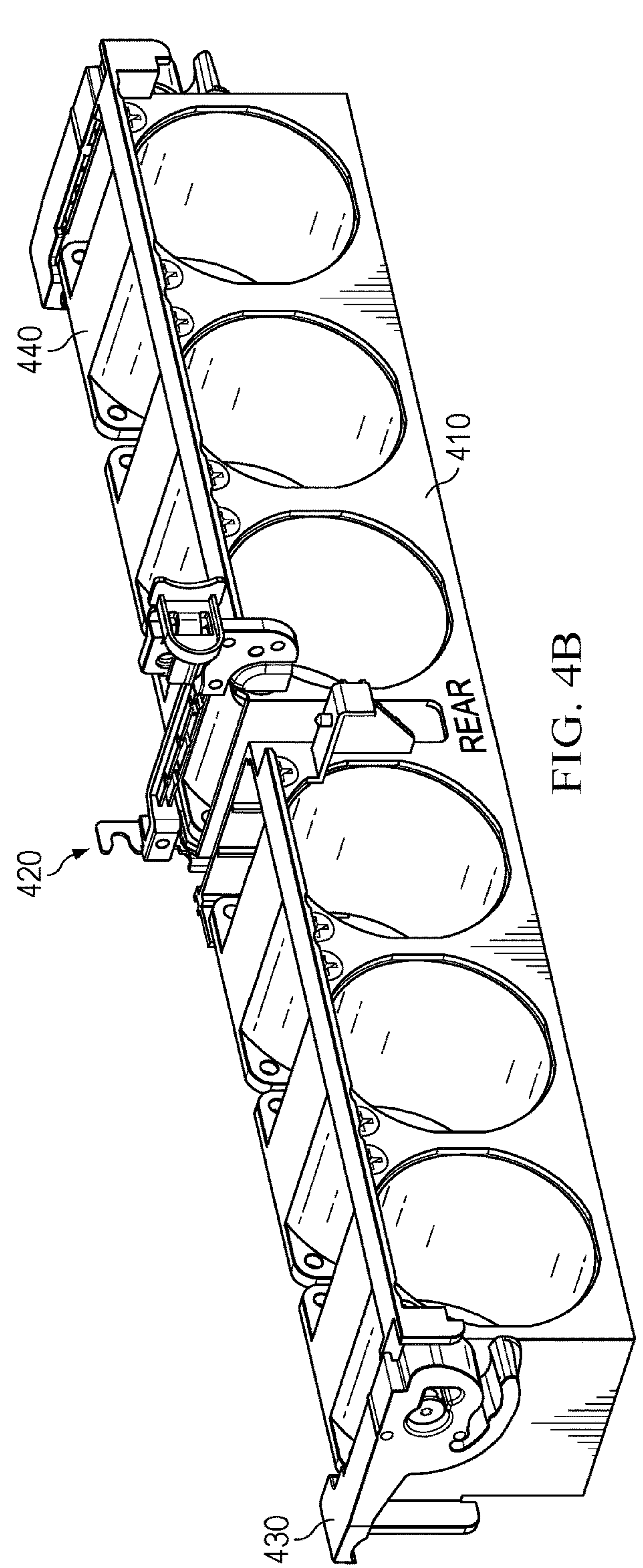
Figure 5:
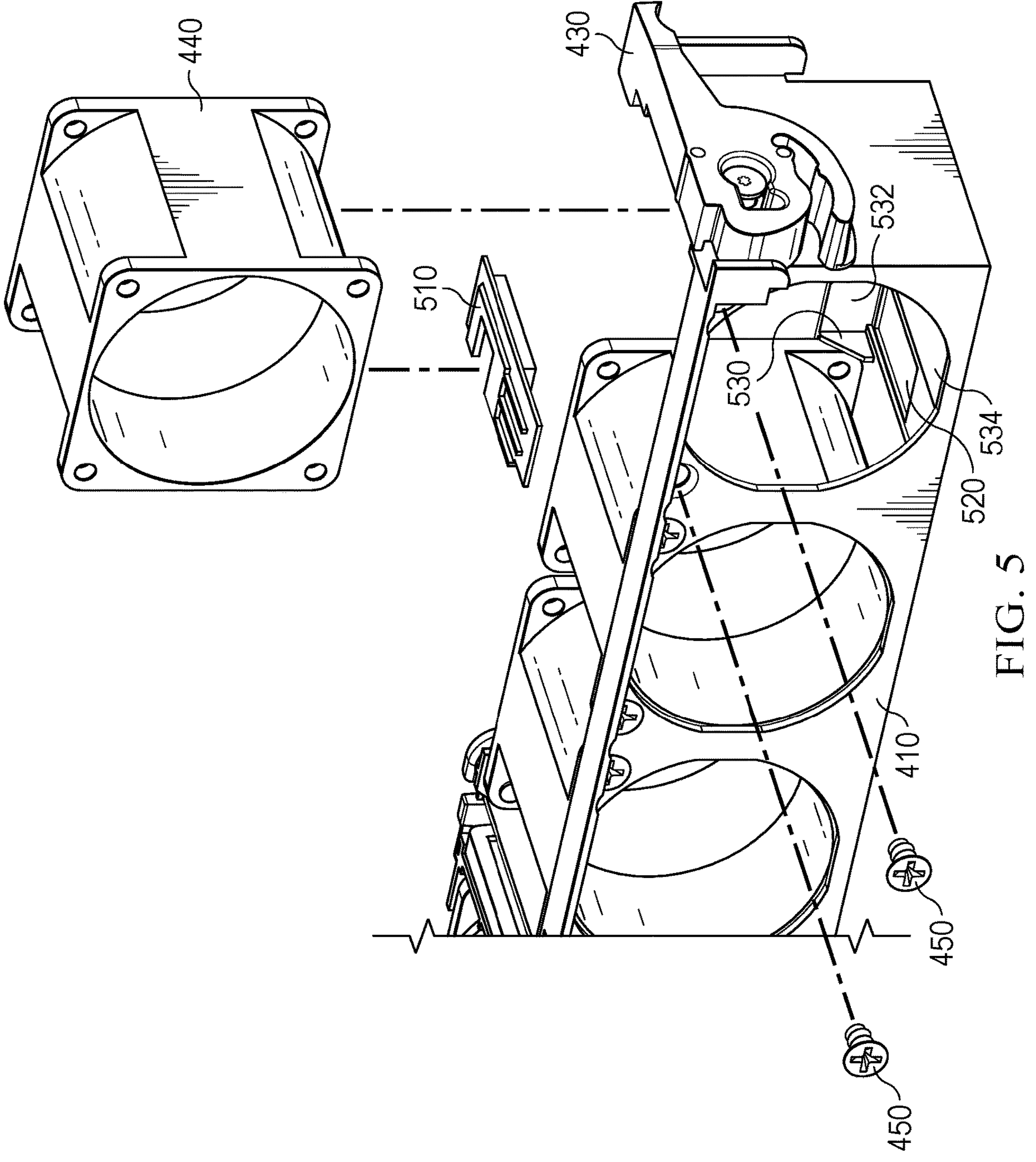
FIG. 5 shows an exploded perspective view of a fan system.

FIGS. 4A and 4B, generally referred to as FIG. 4, show perspective views of a fan system 400. FIG. 5 shows an exploded perspective view 500 of a fan system. In certain embodiments, the fan system 400 corresponds to fan system 150. In certain embodiments, the server fan system 400 provides a single hot-swappable assembly containing a plurality of fans. In certain embodiments, the server fan system 400 corresponds to fan system 150.

This fan system design advantageously improves the rigidity of the fan gantry, leading to less chassis sag. The fan system 500 design advantageously uses the fan housing as a structurally bolstering element for the information handling system chassis. In certain embodiments, the fan body holds a connector cover in place, further simplifying the complexity of the molded gantry. This fan system design advantageously provides the fan system with air sealing features and cable channel optimizations.

More specifically, the fan system 400 includes a fan system gantry component 410, a cable routing portion 420, chassis connection latches 430 and one or more fans 440. Note, throughout the specification and figures, fans 440 are shown without their respective fan blade portions to simplify illustration of the mechanical interaction of the fans 440 with the fan system gantry component 410. In certain embodiments, the fan gantry component 510 includes a monolithic gantry housing. In certain embodiments, the monolithic gantry housing significantly reduces the number of parts in the fan system 400 when compared with previous fan systems. In certain embodiments, the monolithic gantry housing is constructed of plastic. In certain embodiments, structural integrity of the plastic gantry housing is bolstered by constructing the gantry such that each fan 440 provides a structural element in the fan system 400. In certain embodiments, the monolithic gantry housing is designed with air-sealing features which are molded into the part to minimize the need for foam and to optimize cable channels under the gantry. As used herein, a gantry broadly refers to a structure that crosses over an area and supports objects. As used herein, a fan gantry broadly refers to a structure that crosses over an area and supports a plurality of fan components across the area. As used herein, a monolithic fan gantry component broadly refers to a structure constructed from a single piece of material that crosses over an area and supports a plurality of fan across the area.

In certain embodiments, the fan system 400 further includes one or more fasteners 450. In certain embodiments, the fan system 400 includes one or more fan system fan connector components 510. In certain embodiments, the monolithic gantry housing provides flexibility in the placement of the fan system fan connector components 510 on a fan board or planar of the information handling system. In certain embodiments, one or more fasteners 450 and a fan system fan connector component 510 are associated with a respective fan 440. In certain embodiments, one or more fasteners 450, the fan system fan connector component 510, the associated respective fan 440, and a portion of the fan system gantry component 410 provide a fan system sub assembly. In various embodiments, the fan system 400 includes a plurality of fan system sub assemblies. In certain embodiments, the sub assemblies can be serviced to replace individual fans using a tool such as a screwdriver.

In various embodiments, at least one of the plurality of fan system sub assemblies is located on one side of the cable routing portion 420 and another of the plurality of fan systems sub assemblies is located on another side of the cable routing portion 420. In certain embodiments, the cable routing portion 420 may be configured in a closed orientation (see e.g., FIG. 4A) or in an open orientation (see e.g., FIG. 4B). In certain embodiments, the closed orientation holds fan system cables in place when the fan system is installed within an information handling system chassis. In certain embodiments, the open orientation allows fan system cables to be routed between the fan system 400 and a fan controller (not shown) when the fan system is installed within an information handling system chassis.

In certain embodiments, the fan gantry component 410 includes a front wall, a rear wall, a right outside wall, a left outside wall, a top wall, a bottom wall, or a combination thereof. In certain embodiments, the fan gantry component 410 includes the outside right wall and an inside right wall. In certain embodiments, the inside right wall is associated with the cable routing portion 420. In certain embodiments, the fan gantry component 410 includes the outside left wall and an inside left wall. In certain embodiments, the inside left wall is associated with the cable routing portion 420. In certain embodiments, the inside left wall and inside right wall define a slot via which cables may be routed through the fan system 400. In certain embodiments, the rear wall of the fan gantry component 410 includes a cable routing projection. In certain embodiments, the cable routing projection interacts with a cable routing component to route cables through the fan system 400. In certain embodiments, the cable routing portion 420 includes the cable routing component, the cable routing projection, the slot, or a combination thereof. In certain embodiments, the cable routing projection mates with the cable routing component when the cable routing portion 420 is in a closed orientation. In certain embodiments, when the cable routing projection mates with the cable routing component, the cable routing component is removable held in place.

In certain embodiments, the front wall of the fan gantry component 410 vertically extends across a portion of the fans 440. Thus, the front wall of the fan gantry component 410 is shorter than the rear wall of the fan gantry component 410. In certain embodiments, the front wall of the fan gantry component 410 defines a plurality of fan aperture portions. In certain embodiments, each fan aperture portion is associated with a respective fan system sub assembly. In certain embodiments, some of the fan aperture portions are shaped to fit around a bottom portion of a respective fan. In certain embodiments, some of the fan aperture portions are shaped to fit around a bottom portion and a side portion of a respective fan. In certain embodiments, the fan aperture portions that are shaped to fit around a bottom portion and a side portion of a respective fan are positioned contiguous with the cable routing portion 420. In certain embodiments, the front wall of the fan gantry component 410 defines a plurality of front wall fan attachment apertures. In certain embodiments, each front wall fan attachment aperture is associated with a respective fan system sub assembly. In certain embodiments, two front wall fan attachment apertures are associated with a respective fan system sub assembly.

In certain embodiments, the rear wall of the fan gantry component 410 vertically extends across each of the fans 440. Thus, the rear wall of the fan gantry component 410 is taller than the front wall of the fan gantry component 410. In certain embodiments, the rear wall of the fan gantry component 410 defines a plurality of fan apertures. In certain embodiments, each fan aperture is associated with a respective fan system sub assembly. In certain embodiments, the rear wall of the fan gantry component 410 defines a plurality of rear wall fan attachment apertures. In certain embodiments, each rear wall fan attachment aperture is associated with a respective fan system sub assembly. In certain embodiments, two rear wall fan attachment apertures are associated with a respective fan system sub assembly.

In certain embodiments, the fan gantry component 410 includes a top wall projection. In certain embodiments, the top wall projection extends from a top edge of a rear wall of the fan gantry component 410. In certain embodiments, the top wall projection portion includes a right top wall projection and a left top wall projection. In certain embodiments, the right top wall projection and the left top wall projection are separated by the cable routing portion 420. In certain embodiments, the top wall projection is configured to be contiguous with a top panel of an information handing system chassis when the top panel is closed. In certain embodiments, the top wall projection being contiguous with the top panel advantageously provides the fan system 400 with air sealing features.

In certain embodiments, the fan gantry component 410 defines one or more fan connector apertures 520 via which respective fan system fan connector components 510 are physically attached to the fan gantry component 410. In certain embodiments, each fan system sub assembly includes a respective aperture 520.

In certain embodiments, the fan gantry component 410 includes a plurality of front tabs 530. In certain embodiments, each of the front tabs 520 is physically coupled between a front wall 532 and a bottom wall 534 of the fan gantry component 410. In certain embodiments, each of the front tabs 520 includes an angled wall extending from the front wall 532 and the bottom wall 534 of the fan gantry component 410. In certain embodiments, each of the front tabs 520 is associated with a respective fan sub assembly. In certain embodiments, each of the front tabs provides lateral support to hold a respective fan in position along a front edge of the fan system 400. In certain embodiments, a fan is held in place between a right wall of the fan gantry component 410 and a tab 520, between a left wall of the fan gantry component 410 and a tab 520, between two tabs 520, or a combination thereof.

Figure 6A:
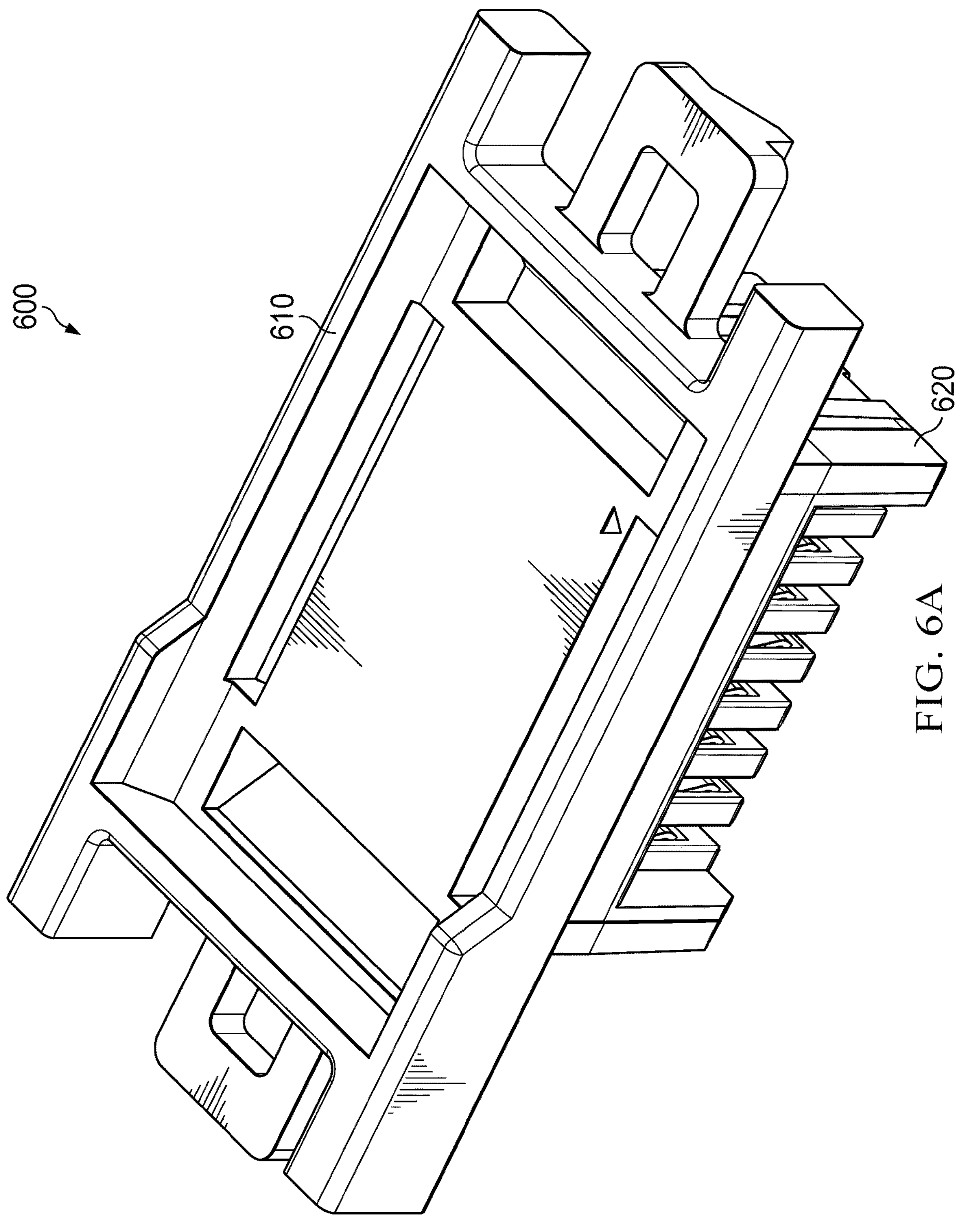
FIGS. 6A and 6B, generally referred to as FIG. 6, respectively show top and bottom perspective views of a fan system fan connector component.
Figure 6B:
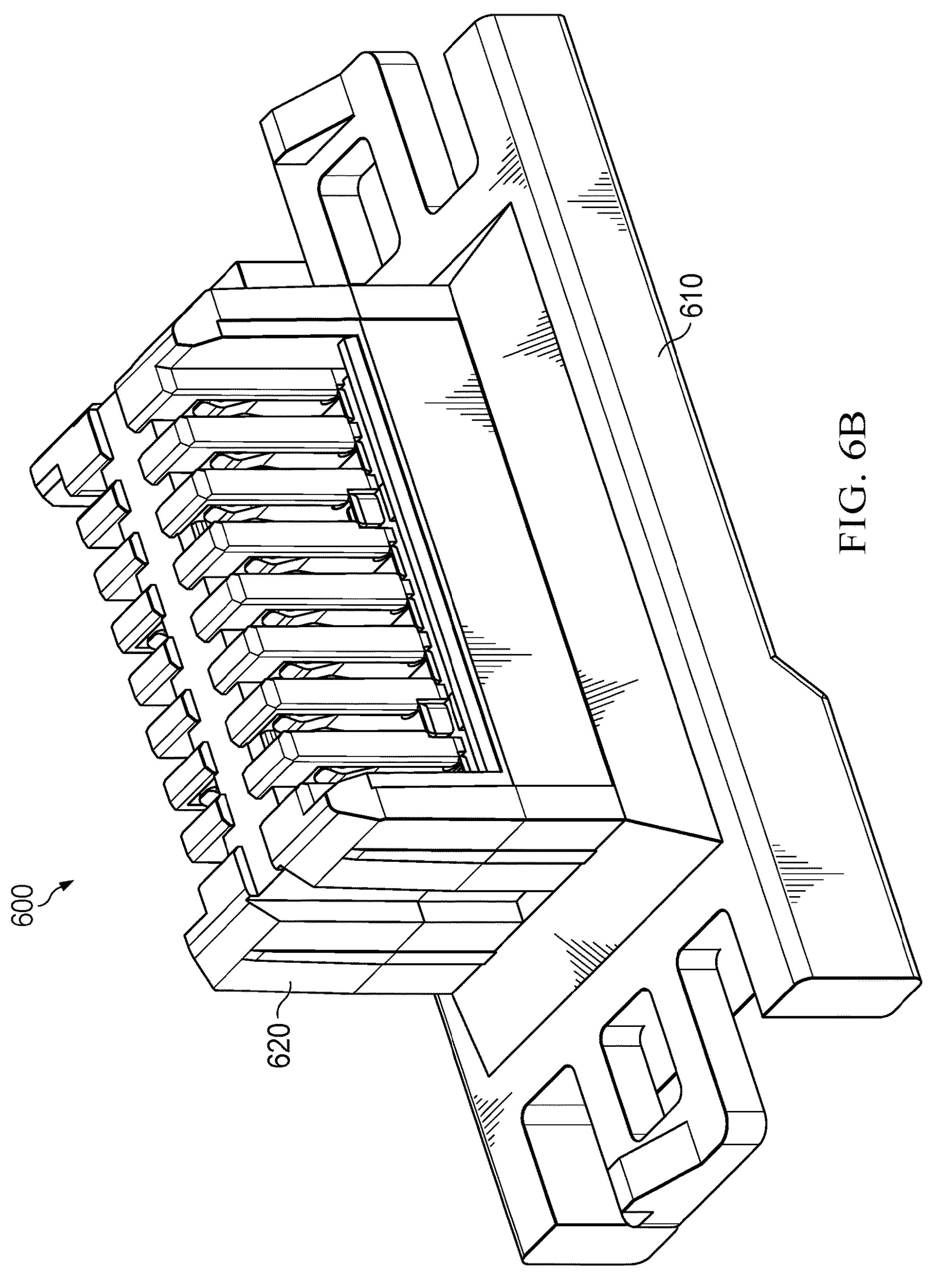
Figure 7:
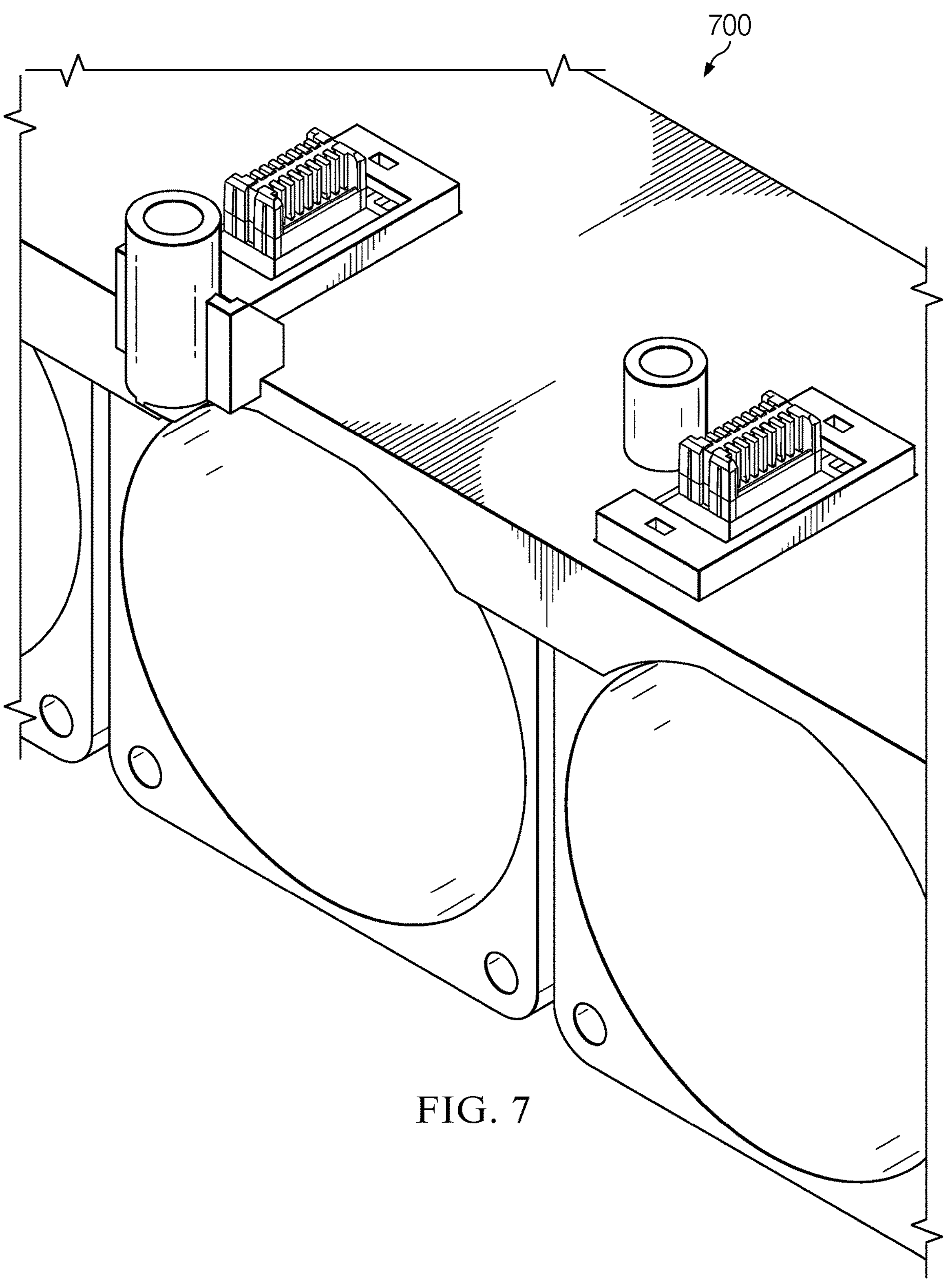
FIG. 7 shows a bottom perspective view of a portion of a fan system.
Figure 8A:
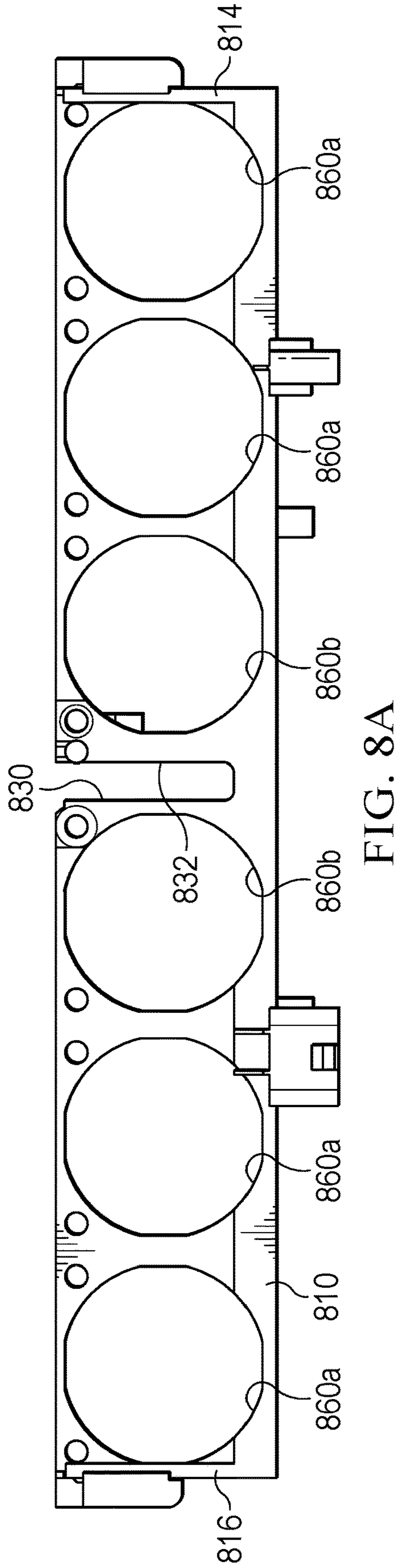
FIGS. 8A, 8B, 8C, 8D, 8E, 8F and 8G, respectively show front, rear, right, left, top, bottom and perspective views of a monolithic fan gantry.
Figure 8B:
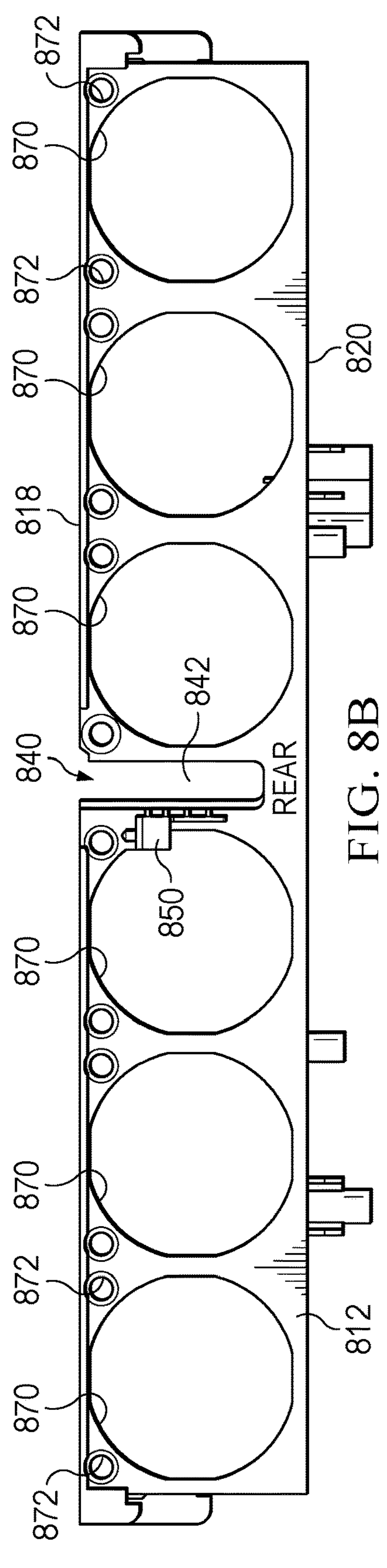
Figure 8C:
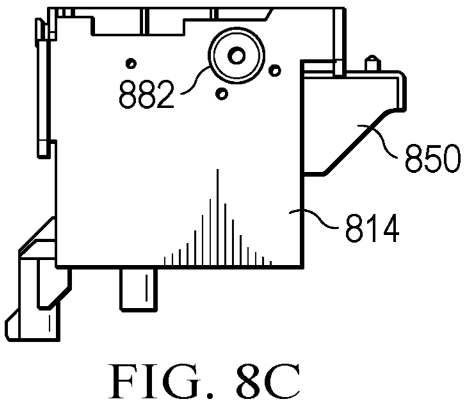
Figure 8D:
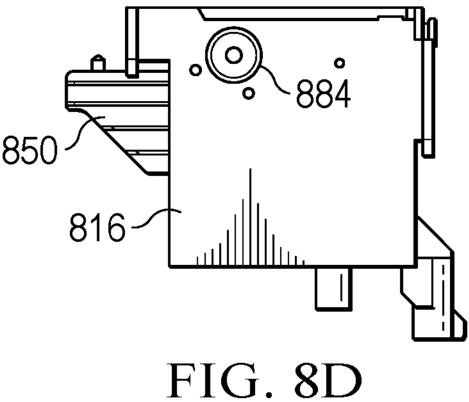
Figure 8E:
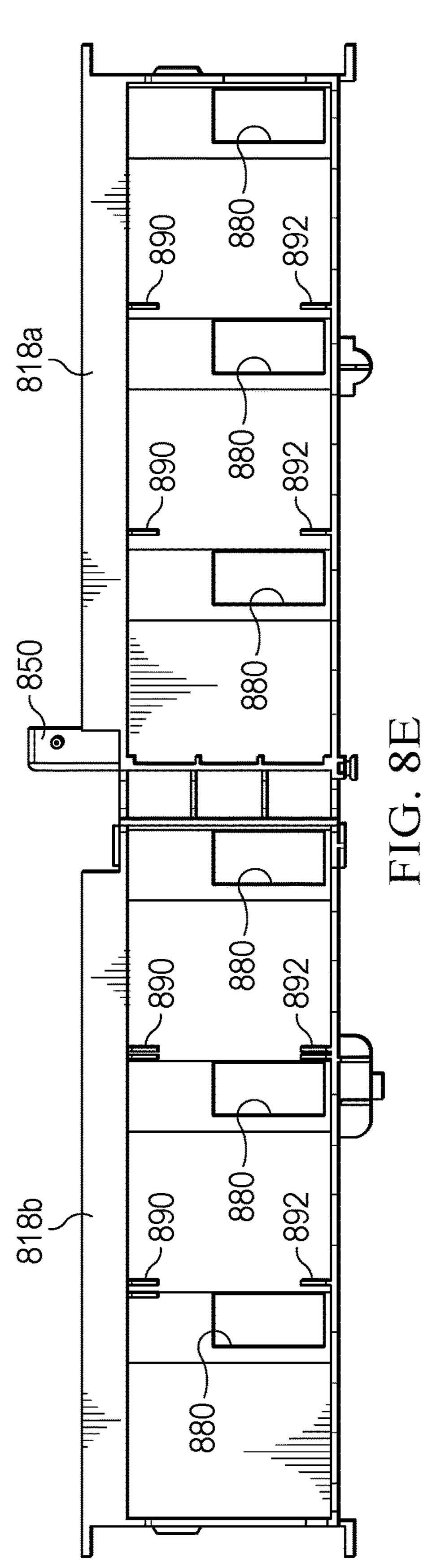
Figure 8F:
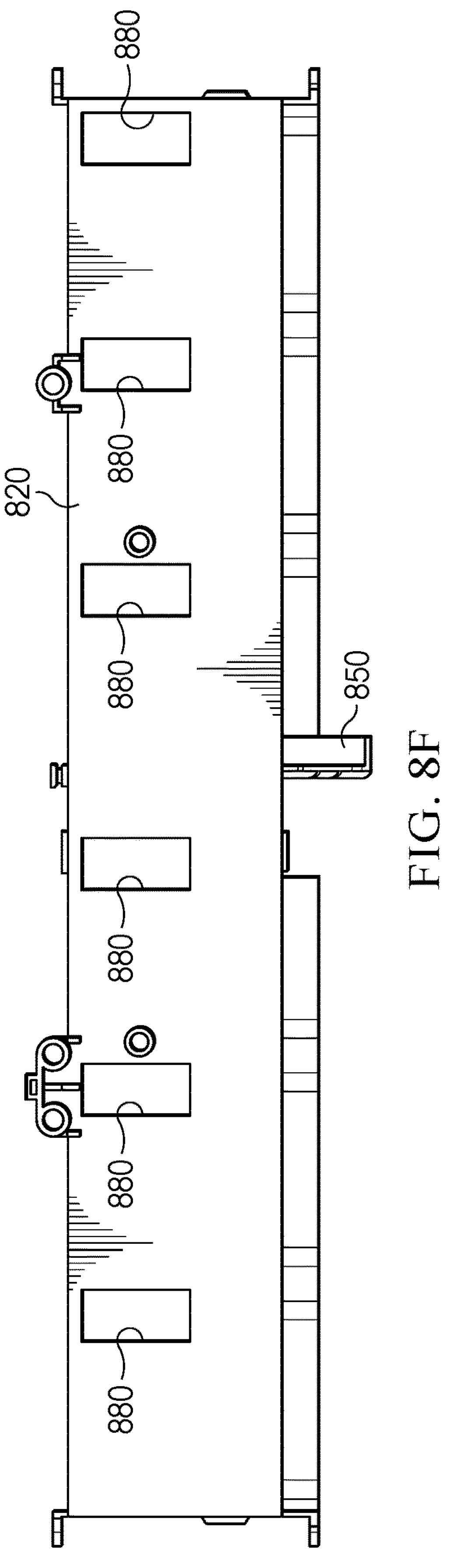
Figure 8G:
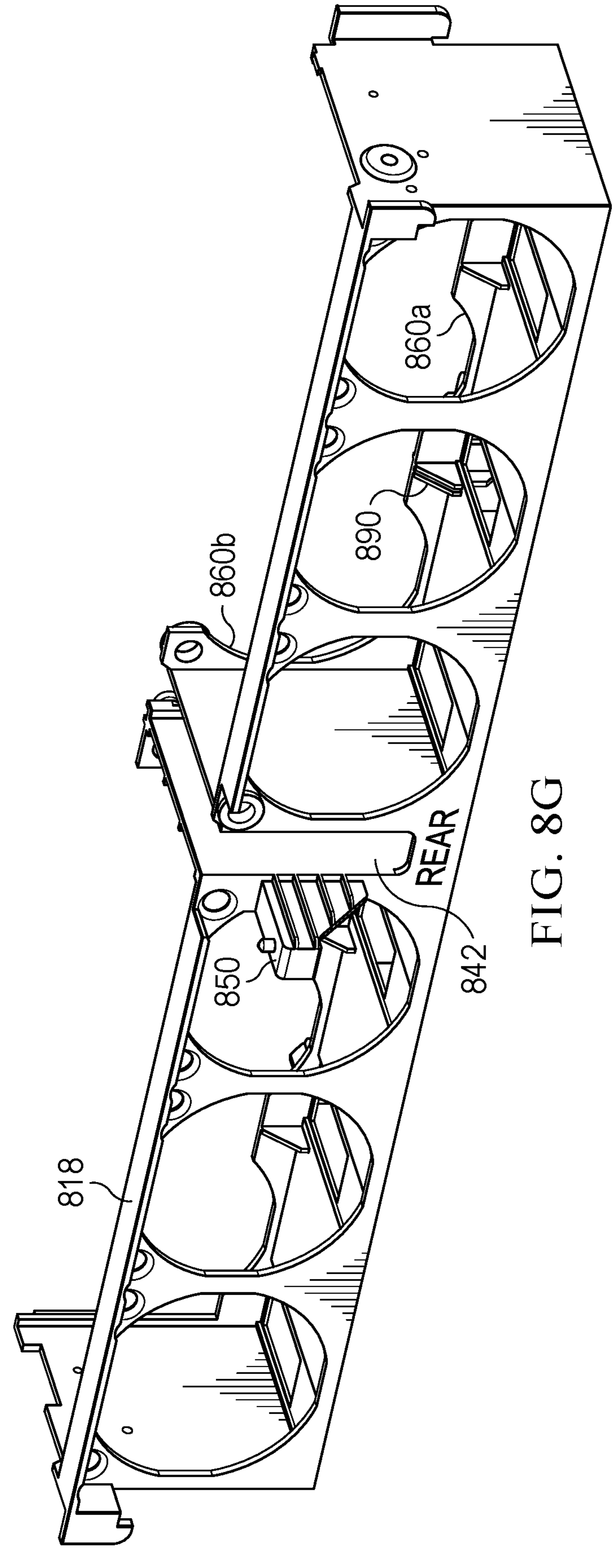

FIGS. 6A and 6B, generally referred to as FIG. 6, respectively show top and bottom perspective views of a fan system fan connector component 600. FIG. 7 shows a bottom perspective view 700 of a portion of a fan system. In certain embodiments, the fan system fan connector component 600 corresponds to fan system fan connector component 510. In certain embodiments, the fan system fan connector component 600 includes a top connection portion 610 and a bottom connection portion 620. In certain embodiments, the top connection portion 610 physically mates with a respective fan, electrically mates with a respective fan, or a combination thereof. In certain embodiments, the bottom connection portion 620 physically mates with a fan controller, electrically mates with a fan controller, or a combination thereof. In certain embodiments, the fan controller may be located on a fan control board, on a planar, or a combination thereof. In certain embodiments, when the fan system connector component 600 is positioned through an aperture defined by a fan gantry housing (see e.g., FIG. 7), the aperture provides enough extra space to allow for tolerances required by the fan of the respective sub assembly.

FIGS. 8A, 8B, 8C, 8D, 8E, 8F and 8G, respectively show front, rear, right, left, top, bottom and perspective views of a monolithic fan gantry 800. In certain embodiments, the monolithic fan gantry 800 corresponds to fan gantry component 410.

In certain embodiments, the monolithic fan gantry 800 includes a front wall 810, a rear wall 812, a right outside wall 814, a left outside wall 816, a top wall 818, a bottom wall 820, or a combination thereof. In certain embodiments, the monolithic fan gantry 800 includes the outside right wall 814 and an inside right wall 830. In certain embodiments, the front wall 810 extends substantially perpendicularly (i.e., +/−20%) from the bottom wall 820. In certain embodiments, the rear wall 812 extends substantially perpendicularly (i.e., +/−20%) from the bottom wall 820. In certain embodiments, the front wall extends substantially perpendicularly (i.e., +/−20%) from the bottom wall 820. In certain embodiments, the right outside wall 814 extends substantially perpendicularly (i.e., +/−20%) from the bottom wall 820. In certain embodiments, the left outside wall 816 extends substantially perpendicularly (i.e., +/−20%) from the bottom wall 820. In certain embodiments, the top wall 818 extends substantially perpendicularly (i.e., +/−20%) from the rear wall 812. In certain embodiments, the inside right wall 830 extends substantially perpendicularly (i.e., +/−20%) from the bottom wall 820. In certain embodiments, the inside left wall 832 extends substantially perpendicularly (i.e., +/−20%) from the bottom wall 820.

In certain embodiments, the inside right wall 830 is associated with a cable routing portion 840. In certain embodiments, the monolithic fan gantry 800 includes the outside left wall 816 and an inside left wall 832. In certain embodiments, the inside left wall 832 is associated with the cable routing portion 840. In certain embodiments, the inside left wall and inside right wall define a slot 842 via which cables may be routed through a fan system. In certain embodiments, the rear wall 812 of the monolithic fan gantry 800 includes a cable routing projection 850. In certain embodiments, the cable routing projection 850 interacts with a cable routing component to route cables through the fan system. In certain embodiments, the cable routing portion 840 includes a cable routing component, the cable routing projection 850, the slot 842, or a combination thereof. In certain embodiments, the cable routing projection mates 850 with the cable routing component when the cable routing portion 840 is in a closed orientation. In certain embodiments, when the cable routing projection 850 mates with the cable routing component, the cable routing component is removable held in place.

In certain embodiments, the front wall 810 of the monolithic fan gantry 800 vertically extends across a portion of the fans. Thus, the front wall 810 of the monolithic fan gantry 800 is shorter than the rear wall 812 of the monolithic fan gantry 800. In certain embodiments, the front wall 810 of the monolithic fan gantry 800 defines a plurality of fan aperture portions 860. In certain embodiments, each fan aperture portion 860 is associated with a respective fan system sub assembly. In certain embodiments, some of the fan aperture portions (e.g., fan aperture portion 860*a*) are shaped to fit around a bottom portion of a respective fan. In certain embodiments, some of the fan aperture portions (e.g., fan aperture portion 860*b*) are shaped to fit around a bottom portion and a side portion of a respective fan. In certain embodiments, the fan aperture portions 860*b* that are shaped to fit around a bottom portion and a side portion of a respective fan are positioned contiguous with the cable routing portion 840. In certain embodiments, the front wall 810 of the monolithic fan gantry 800 defines a plurality of front wall fan attachment apertures (not shown). In certain embodiments, each front wall fan attachment aperture is associated with a respective fan system sub assembly. In certain embodiments, two front wall fan attachment apertures are associated with a respective fan system sub assembly.

In certain embodiments, the rear wall 812 of the monolithic fan gantry 800 vertically extends across each of the fans. Thus, the rear wall 812 of the monolithic fan gantry 800 is taller than the front wall 810 of the monolithic fan gantry 800. In certain embodiments, the rear wall 812 of the monolithic fan gantry 800 defines a plurality of fan apertures 870. In certain embodiments, each fan aperture 870 is associated with a respective fan system sub assembly. In certain embodiments, the rear wall 812 of the monolithic fan gantry 800 defines a plurality of rear wall fan attachment apertures 872. In certain embodiments, each rear wall fan attachment aperture 872 is associated with a respective fan system sub assembly. In certain embodiments, two rear wall fan attachment apertures 870 are associated with a respective fan system sub assembly. In certain embodiments, attachment of a plurality of fans to the fan gantry 800 via the fan attachment apertures bolsters structural integrity of the fan gantry 800.

In certain embodiments, the monolithic fan gantry 800 includes a top wall projection 818. In certain embodiments, the top wall projection 818 extends from a top edge of a rear wall 812 of the monolithic fan gantry 800. In certain embodiments, the top wall projection portion 810 includes a right top wall projection 818*a* and a left top wall projection 818*b*. In certain embodiments, the right top wall projection 818*a* and the left top wall projection 818*b* are separated by the cable routing portion 840. In certain embodiments, the top wall projection 818 is configured to be contiguous with a top panel of an information handing system chassis when the top panel is closed. In certain embodiments, the top wall projection 818 being contiguous with the top panel advantageously provides the fan system 400 with air sealing features.

In certain embodiments, the monolithic fan gantry 800 defines one or more fan connector apertures 880 via which respective fan system fan connector components are physically attached to the monolithic fan gantry 800. In certain embodiments, each fan system sub assembly includes a respective aperture 880. In certain embodiments, the right wall 814 defines a latch aperture 882 via which a fan system retention latch may be pivotably attached to the monolithic fan gantry 800. In certain embodiments, the left wall 816 defines a latch aperture 884 via which a fan system retention latch may be pivotably attached to the monolithic fan gantry 800.

In certain embodiments, the monolithic fan gantry 800 includes a plurality of front retention tabs 890. In certain embodiments, each of the front retention tabs 890 is physically coupled between the front wall 810 and the bottom wall 820 of the monolithic fan gantry 800. In certain embodiments, each of the retention front tabs 890 includes an angled wall extending from the front wall 810 and the bottom wall 820 of the monolithic fan gantry 800. In certain embodiments, each of the front retention tabs 890 is associated with a respective fan sub assembly. In certain embodiments, each of the front retention tabs provides lateral support to hold a respective fan in position along a front edge of the fan gantry 800. In certain embodiments, a fan is held in place between a right wall 814, 830 of the monolithic fan gantry 800 and a retention tab 890, between a left wall 816, 832 of the monolithic fan gantry 800 and a retention tab 890, between two retention tabs 890, or a combination thereof.

In certain embodiments, the monolithic fan gantry 800 includes a plurality of rear retention tabs 892. In certain embodiments, each of the rear retention tabs 892 is physically coupled between the rear wall 812 and the bottom wall 820 of the monolithic fan gantry 800. In certain embodiments, each of the rear retention tabs 892 includes an angled wall extending from the rear wall 812 and the bottom wall 820 of the monolithic fan gantry 800. In certain embodiments, each of the rear retention tabs 892 is associated with a respective fan sub assembly. In certain embodiments, each of the rear retention tabs provides lateral support to hold a respective fan in position along a rear edge of the fan gantry 800. In certain embodiments, a fan is held in place between a right wall 814, 830 of the monolithic fan gantry 800 and a retention tab 892, between a left wall 816, 832 of the monolithic fan gantry 800 and a retention tab 892, between two retention tabs 892, or a combination thereof.

Figure 9:
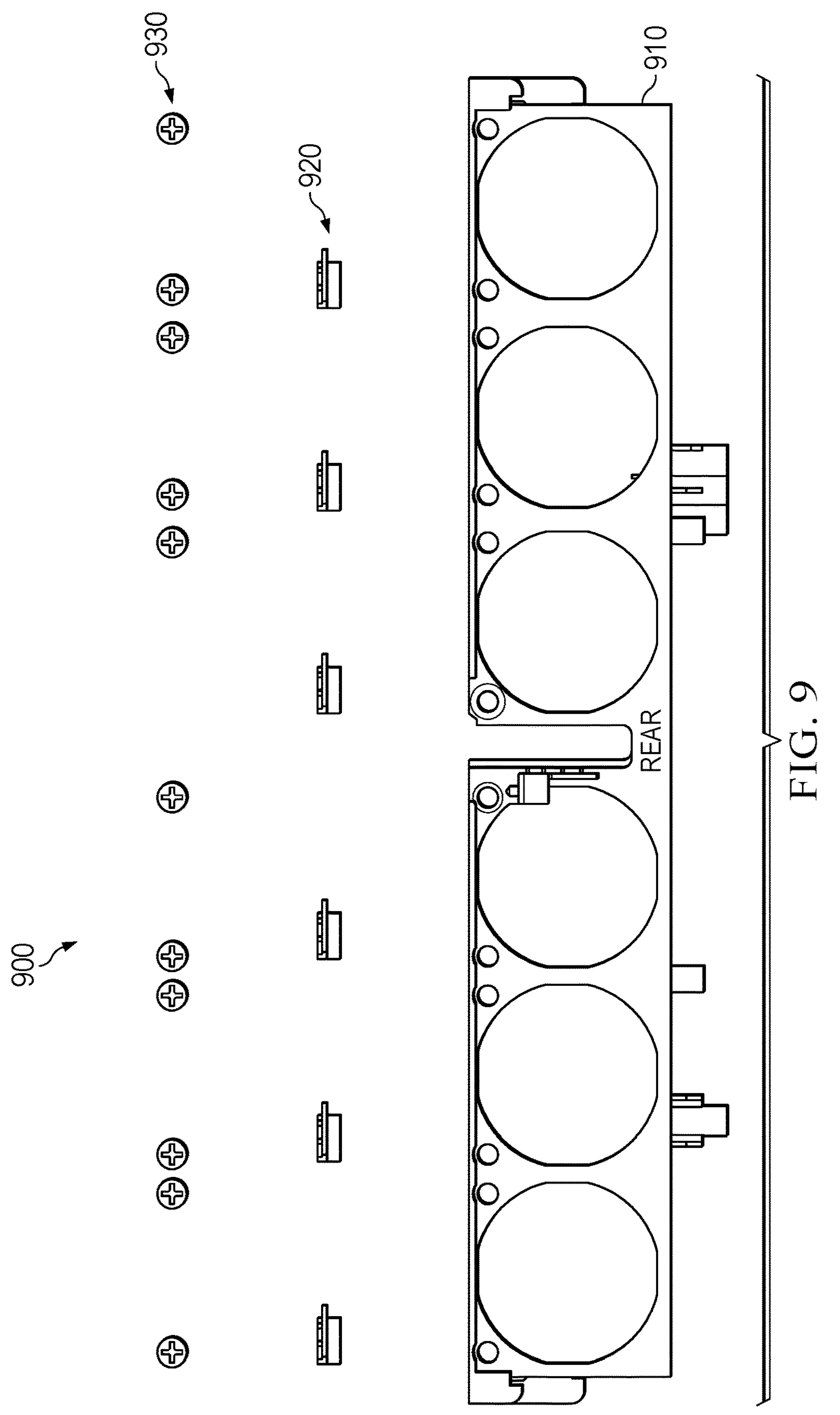
FIG. 9 shows a decomposed rear view of components of a fan system.

FIG. 9 shows a decomposed rear view of components of a fan system 900. In certain embodiments, the fan system 900 corresponds to a portion of fan system 150. In certain embodiments, the components of the fan system 900 include a monolithic fan gantry 910, one or more fan system fan connector components 920 and one or more fasteners 920.

In certain embodiments, by providing such a monolithic fan gantry 910, a fan system can be constructed using fewer parts and with fewer different part numbers when compared with previous fan system designs. In various embodiments, certain previous fan system designs often required four or more components, which were more complicated, and thus costly, to produce, when compared with the components of the components of the fan system 900. In various embodiments, each of the components of certain previous fan system designs had a corresponding part number, thus requiring four or more different part numbers.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A fan system gantry component, comprising:

a bottom wall, the bottom wall defining a plurality of fan connector apertures, each of the plurality of fan connector apertures being positioned to receive a respective fan connection component, each fan system connection component being coupled between a respective fan of a plurality of fans and a fan controller;

a front wall physically attached to the bottom wall, the front wall extending substantially perpendicularly from the bottom wall, the front wall defining a plurality of fan aperture portions; and, a rear wall physically attached to the bottom wall, the rear wall extending substantially perpendicularly from the bottom wall, the rear wall defining a plurality of fan apertures and a plurality of rear wall fan attachment apertures, the plurality of rear wall fan attachment apertures being positioned to enable attachment of a plurality of fans to the rear wall of the fan system gantry component, attachment of the plurality of fans to the fan system gantry component bolstering structural integrity of the fan system gantry component; and wherein each fan system connection component is held against the bottom wall when the respective fan component is attached to the rear wall of the fan system gantry component.

2. The fan system gantry component of claim 1, wherein:

each fan system connection component comprises a top connection portion and a bottom connection portion, the top connection portion mating with a respective fan, the bottom connection portion mating with the fan controller.

3. The fan system gantry component of claim 1, further comprising:

a right outside wall physically attached to the bottom wall, the right outside wall extending substantially perpendicularly from the bottom wall; and, a left outside wall physically attached to the bottom wall, the left outside wall extending substantially perpendicularly from the bottom wall.

4. The fan system gantry component of claim 3, further comprising:

a right inside wall physically attached to the bottom wall, the right inside wall extending substantially perpendicularly from the bottom wall; and, a left inside wall physically attached to the bottom wall, the left inside wall extending substantially perpendicularly from the bottom wall; and wherein the right inside wall and the left inside wall define a slot of a cable routing portion.

5. The fan system gantry component of claim 1, further comprising:

a top wall physically attached to a top edge of the rear wall, the top wall extending substantially perpendicularly from the rear wall, the top wall being contiguous with an inside of a top panel of an information handling system chassis when the fan system gantry component is mounted within the information handling system chassis.

6. The fan system gantry component of claim 1, further comprising:

a plurality of retention tabs, each of the plurality of retention tabs providing lateral support to hold a respective fan of the plurality of fans along an edge of the fan system gantry component.

7. A fan system comprising:

a plurality of fans; and, a fan system gantry component, the fan system gantry component comprising a bottom wall, the bottom wall defining a plurality of fan connector apertures, each of the plurality of fan connector apertures being positioned to receive a respective fan connection component, each fan system connection component being coupled between a respective fan of the plurality of fans and a fan controller;

a front wall physically attached to the bottom wall, the front wall extending substantially perpendicularly from the bottom wall, the front wall defining a plurality of fan aperture portions; and, a rear wall physically attached to the bottom wall, the rear wall extending substantially perpendicularly from the bottom wall, the rear wall defining a plurality of fan apertures and a plurality of rear wall fan attachment apertures, the plurality of rear wall fan attachment apertures being positioned to enable attachment of the plurality of fans to the rear wall of the fan system gantry component, attachment of the plurality of fans to the fan system gantry component bolstering structural integrity of the fan system gantry component; and wherein each fan system connection component is held against the bottom wall when the respective fan component is attached to the rear wall of the fan system gantry component.

8. The fan system of claim 7, wherein:

each fan system connection component comprises a top connection portion and a bottom connection portion, the top connection portion mating with a respective fan, the bottom connection portion mating with the fan controller.

9. The fan system of claim 7, wherein the fan system gantry component further comprises:

a right outside wall physically attached to the bottom wall, the right outside wall extending substantially perpendicularly from the bottom wall; and, a left outside wall physically attached to the bottom wall, the left outside wall extending substantially perpendicularly from the bottom wall.

10. The fan system of claim 9, wherein the fan system gantry component further comprises:

a right inside wall physically attached to the bottom wall, the right inside wall extending substantially perpendicularly from the bottom wall; and, a left inside wall physically attached to the bottom wall, the left inside wall extending substantially perpendicularly from the bottom wall; and wherein the right inside wall and the left inside wall define a slot of a cable routing portion.

11. The fan system of claim 7, wherein the fan system gantry component further comprises:

a top wall physically attached to a top edge of the rear wall, the top wall extending substantially perpendicularly from the rear wall, the top wall being contiguous with an inside of a top panel of an information handling system chassis when the fan system gantry component is mounted within the information handling system chassis.

12. The fan system of claim 7, wherein the fan system gantry component further comprises:

a plurality of retention tabs, each of the plurality of retention tabs providing lateral support to hold a respective fan of the plurality of fans along an edge of the fan system gantry component.

13. A system comprising:

a processor;

a data bus coupled to the processor;

a fan system comprising a plurality of fans; and, a fan system gantry component, the fan system gantry component comprising a bottom wall, the bottom wall defining a plurality of fan connector apertures, each of the plurality of fan connector apertures being positioned to receive a respective fan connection component, each fan system connection component being coupled between a respective fan of the plurality of fans and a fan controller;

a front wall physically attached to the bottom wall, the front wall extending substantially perpendicularly from the bottom wall, the front wall defining a plurality of fan aperture portions; and, a rear wall physically attached to the bottom wall, the rear wall extending substantially perpendicularly from the bottom wall, the rear wall defining a plurality of fan apertures and a plurality of rear wall fan attachment apertures, the plurality of rear wall fan attachment apertures being positioned to enable attachment of the plurality of fans to the rear wall of the fan system gantry component, attachment of the plurality of fans to the fan system gantry component bolstering structural integrity of the fan system gantry component; and wherein each fan system connection component is held against the bottom wall when the respective fan component is attached to the rear wall of the fan system gantry component.

14. The system of claim 13, wherein:

each fan system connection component comprises a top connection portion and a bottom connection portion, the top connection portion mating with a respective fan, the bottom connection portion mating with the fan controller.

15. The system of claim 13, wherein the fan system gantry component further comprises:

a right outside wall physically attached to the bottom wall, the right outside wall extending substantially perpendicularly from the bottom wall; and, a left outside wall physically attached to the bottom wall, the left outside wall extending substantially perpendicularly from the bottom wall.

16. The system of claim 15, wherein the fan system gantry component further comprises:

a right inside wall physically attached to the bottom wall, the right inside wall extending substantially perpendicularly from the bottom wall; and, a left inside wall physically attached to the bottom wall, the left inside wall extending substantially perpendicularly from the bottom wall; and wherein the right inside wall and the left inside wall define a slot of a cable routing portion.

17. The system of claim 13, wherein the fan system gantry component further comprises:

a top wall physically attached to a top edge of the rear wall, the top wall extending substantially perpendicularly from the rear wall, the top wall being contiguous with an inside of a top panel of an information handling system chassis when the fan system gantry component is mounted within the information handling system chassis.

18. The system of claim 17, wherein the fan system gantry component further comprises:

a plurality of retention tabs, each of the plurality of retention tabs providing lateral support to hold a respective fan of the plurality of fans along an edge of the fan system gantry component.

* * * * *